United States Patent [19]

Wössner et al.

[11] 4,034,704
[45] July 12, 1977

[54] SUBSTRATE SUPPORT FOR VACUUM COATING INSTALLATION

[75] Inventors: Hermann Wössner, Balzers, Liechtenstein; Roman Schertler, Wolfurt, Austria

[73] Assignee: Balzers Patent und Beteiligungs AG, Liechtenstein

[21] Appl. No.: 719,707

[22] Filed: Sept. 2, 1976

[30] Foreign Application Priority Data

Sept. 2, 1975 Switzerland .................. 011355/75

[51] Int. Cl.² ...................................... C23C 13/08
[52] U.S. Cl. ................................................ 118/49
[58] Field of Search ................................ 118/48–53; 427/242

[56] References Cited

U.S. PATENT DOCUMENTS

| | | | |
|---|---|---|---|
| 3,128,205 | 4/1964 | Illsley | 118/48 UX |
| 3,442,572 | 5/1969 | Illsley et al. | 118/49 X |
| 3,598,083 | 8/1971 | Dort et al. | 118/48 |
| 3,749,058 | 7/1973 | Slabaugh | 118/48 |
| 3,783,821 | 1/1974 | Dobson et al. | 118/48 |
| 3,858,547 | 1/1975 | Bergfelt | 118/53 |

*Primary Examiner*—Ronald Feldbaum
*Attorney, Agent, or Firm*—McGlew and Tuttle

[57] ABSTRACT

The support is rotated by a central drive shaft extending into a vacuum chamber in sealed relation thereto, with the central drive shaft having support arms secured thereto and each carrying a respective support head, each support head having several substrate holding plates rotatably mounted thereon and coupled together by a respective gear train for turning about their axes of rotation. Each support head is rotatable by a respective support head drive shaft coupled to the central drive shaft through gearing and carrying a driving gear forming part of the gear train. A respective fixed cam plate is secured to each support head and has a stop cooperable with two oppositely acting pawls mounted on the support head. A respective second cam plate is secured to the driving gear of each gear train, and includes cam portions cooperable with the pawls and cam portions cooperable with an abutment on the associated support head. The pawls are effective alternately to connect each fixed cam plate to the associated second cam plate in accordance with respective opposite directions of rotation of the central drive shaft. The drive moment exerted on each support head drive shaft effects rotation of the support head only when the turning position of the associated support plates corresponds to the direction of rotation of the central drive shaft and, when the direction of rotation of the central drive shaft is reversed, one pawl is disengaged from the stop on the fixed cam plate and the other pawl is engaged with such stop. The second cam plate then rotates with the drive gear to effect turning of the associated support plates and thereafter engages the abutment on the support head for rotation of the support head in the reverse direction, so that each direction of rotation of the support heads is associated with a specific turning position of the associated support plates.

5 Claims, 4 Drawing Figures

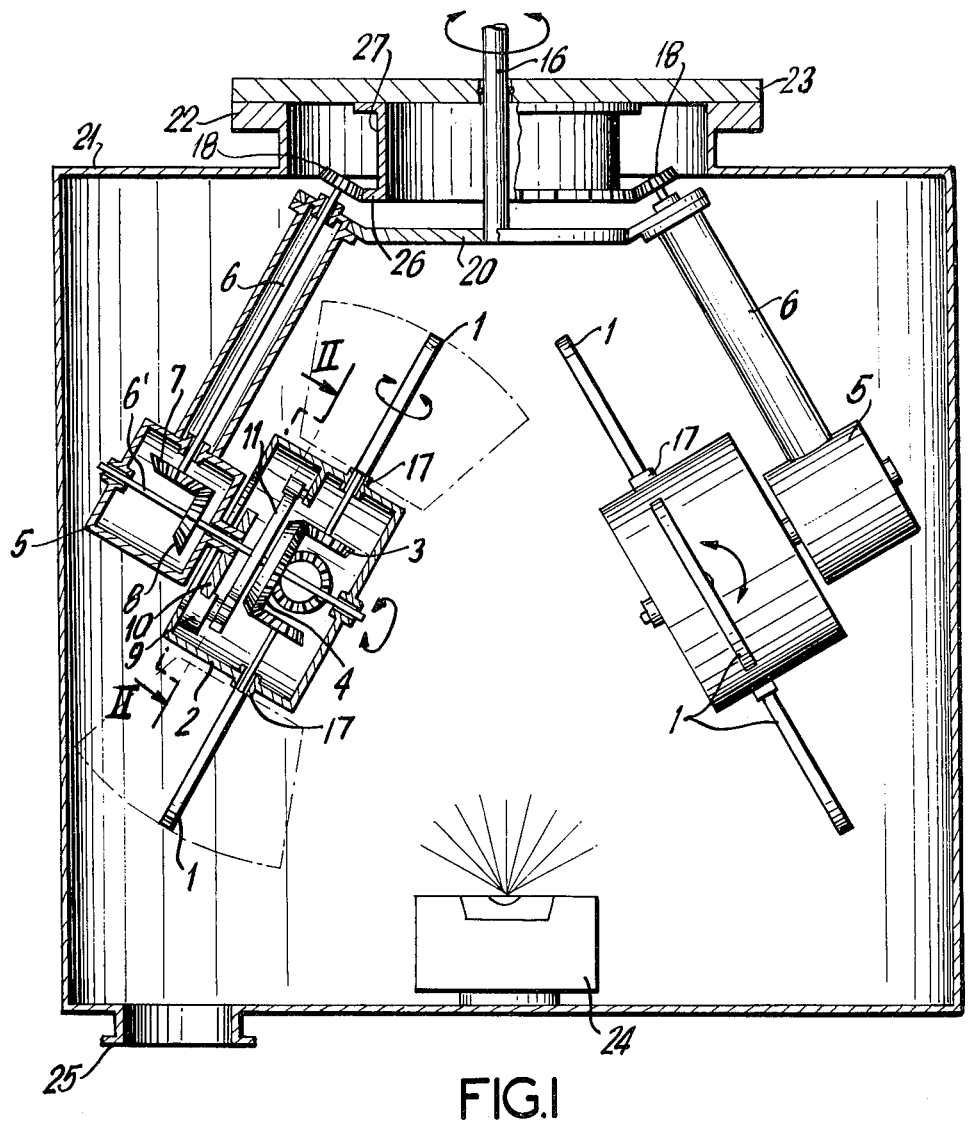
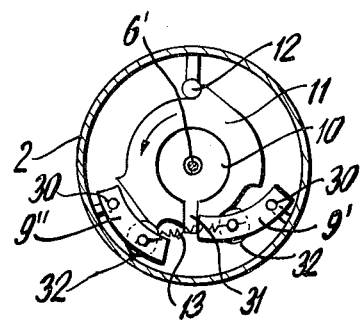
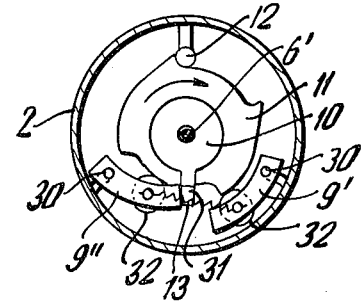
FIG.1
FIG.2a FIG.2b

SUBSTRATE SUPPORT FOR VACUUM COATING INSTALLATION

FIELD AND BACKGROUND OF THE INVENTION

This invention relates to vacuum coating installations of the type comprising an evacuable chamber and a rotatable substrate support, for the objects to be coated, arranged in the chamber. In vacuum coating installations, preferably vacuum vapor deposition installations or cathode disintegration installations, it is known how to set into rotation the holding device for the objects to be coated, this device being usually designed as a rotating basket, in order to obtain a more uniform coating. There are also known holding devices, with a central drive and with turnable support plates for the objects to be coated, and which support plates can be turned without interruption of the vacuum. This is advantageous because, with such an arrangement, objects can be placed on both sides of the support plates and the installation can thus be used more economically, or the objects, for example, lenses, which are fastened in recesses of the support plates, can be coated on both sides in one operation.

Holding and turning devices for vacuum coating installations have been disclosed in numerous patent publications, for example, in DP No. 962,488, DP No. 966,014, U.S. Pat. Nos. 2,532,971, 2,260,471, 3,396,696 and 3,643,625, DT-OS No. 1,913,318, DT-OS No. 2,209,857, DT-AS No. 2,306,173, and Oe-PS No. 199,904.

Insofar as they permit both the mentioned rotary movement and the mentioned turning of the support plates for the objects to be coated, the known systems usually comprise separate drive mechanisms for these two movements, and therefore usually include two separate, vacuum-proof, motion-transmitting bushings. Some of the known systems are very space-consuming and, because of the complications of their drives, are very prone to trouble.

The vacuum coating installation disclosed in DT-OS No. 2,306,173 avoids the mentioned disadvantage. This installation consists of an evacuable chamber, a holding device rotatable therein and having holding plates for the objects to be coated, associated means for the coating of these objects, preferably, with a vaporization or cathode disintegration system, drive means for setting the holding device into rotation about a preferably vertical axis during coating, and additional means for turning the support plates and thereby bringing them into two different coating positions. It is typical of this known installation that a drive ring, mounted for rotation about the axis of the rotatable holding device, is provided, and is so coupled with the turning mechanism of the support plates that, to each of the two directions of rotation of the drive ring, there corresponds one direction of turning of the support plates, and that additional means are provided for blocking the turning movement in the respective direction after attainment of one of the two coating positions so that, upon further rotation of the drive ring, the holding device carrying the holding plates is taken along by the drive ring in the same direction.

It has now been found that this known system is not satisfactory, inasmuch as the turning of the holding plates did not occur safely or with sufficient reliability. This difficulty appears, in particular, in coating installations in which additional heating means are provided in order to maintain the substrates at elevated temperatures during the coating, as is necessary for some coating processes. Such heating systems usually are designed as radiators arranged above the holding device for the substrates. Due to the temperature gradients then occuring in the structural elements of the system, and the resulting different thermal expansions of these parts, it may happen that a blocking of the relative movement between the drive ring, on the one hand, and the gears causing the turning of the individual holding plates, on the other hand, occurs before the turning movement is completed, that is, while the holding plates are still in an intermediate position between the two coating positions. If this occurs, the vapor deposition process must be interrupted and the vacuum chamber must be opened, often resulting in spoiling of the coating material then in the installation, or at the least, causing loss of time.

In another known coating unit disclosed in DT-OS No. 1,913,318, there is also avoided a separate movement-transmitting bushing for the turning of the holding plates, by appropriate coupling members for the actuation of more than one of the movable systems arranged in the vacuum space. This comprises a support plate, for the objects to be coated, rotatable in the interior of a vacuum bell about a vertical axis, with a mechanism which flips the support over by 180° about an axis directed approximately normal to its axis of rotation, and which is arranged and designed so that the setting in motion of its operative cycles occurs through structural elements already extending into the evacuated space from the outside and used for the actuation of further functions of the overall installation. In particular, in this known installation, the flapping mechanism can be operated by means of the actuating system for the diaphragm associated with the vaporization or disintegration source.

Such a coupling between the actuation of the diaphragm and the turning of the holding plates is, however, undesirable and permissible only for specific applications, for which the machanism then must be constructed accordingly. In the known disclosure, there is mentioned an example where the turning movement is coupled with the actuating means for the diaphragm, present over a vaporization source, in such a way that, for the purpose of initiating the vapor deposition process, the diahragm can be opened without the turning mechanism going into action. However, if the diaphragm then is closed again to interrupt the vapor deposition, the turning of the holding plates through 180° is effected simultaneously through a corresponding switching cam. Thus, such an arrangement permits only a single vapor coating of one plate side, and multiple coats cannot be produced therewith. In a further embodiment of this known arrangement, the flapping over can be repeated any number of times in the same vacuum, but the coupling between turning of the substrate supports and actuation of the diaphragm persists.

SUMMARY OF THE INVENTION

In contradistinction, the objective of the present invention is to provide a substrate support, for vacuum coating installations, in which turning of the substrate holding plates can be effected independently of the actuation of other operating elements of the installation, but without the necessity for a separate movement-transmitting bushing. For this purpose, there can be used, as already suggested in the case of the installation disclosed in DT-OS No. 2,306,173, the movement-transmitting bushing for the rotation of the holding plates during the coating, as this is the only function in a coating installation where the direction of rotation is of no importance. Consequently, the direction of rotation can be utilized for the fixing of two coating positions, namely, the turning of the holding plates to one side or to the other side.

The invention provides a new operationally safe construction for this purpose. At the same time, the substrate support, in accordance with the invention, is designed as a so-called planetary gear train, that is, during the coating, the holding plates move about a central, and usually vertical, axis, and additionally about a second axis, which is usually perpendicular to the first axis. Such planetary gear trains are known per se and have proved successful in the coating technique. The special object underlying the present invention is therefore to provide a novel substrate holder designed as a planetary gear train, with the coating position of the support plates being fixed only responsive to the direction of rotation, and with no additional movement mechanism being necessary for turning of the plates between two different positions.

The rotating substrate support embodying the invention, for vacuum coating installations with a central drive be means of a central drive shaft extending into the vacuum chamber in sealed relation, includes several holding arms on the central drive shaft each carrying a respective support head. Each support head carries several respective substrate holding plates rotatably mounted thereon and coupled together through a gear drive, and which plates can execute a turning movement about the axis of rotation. The invention is particularly characterized in that, by means of two oppositely acting pawls mounted on the support head, in cooperation with a fixed cam plate, on the one hand, and an oscillatable cam plate, secured to a drive gear, on the other hand, there is brought about that the drive movement exerted on the drive shaft can effect a rotational movement of the support head only when the turning position of the support plates thereof corresponds to the sense of the direction of rotation, and otherwise, initially a turning movement is forcibly brought about, so that each of the two directions of rotation is associated with a specific turning position of the support plates.

An object of the invention is to provide an improved substrate support for vacuum coating installations.

Another object of the invention is to provide such a substrate support in which turning of the substrate holding plates can be effected independently of the actuation of other elements of the installation, but with no necessity for a separate movement-transmitting bushing.

A further object of the invention is to provide a substrate support designed as a planetary gear train in which the coating position is set only by the direction of rotation, and no additional movement mechanism is necessary for turning the plates.

For an understanding of the principles of the invention, reference is made to the following description of a typical embodiment thereof as illustrated in the accompanying drawings.

BRIEF DESCRIPTION OF THE DRAWINGS

In the drawing:

FIG. 1 is a vertical sectional view through a vacuum vapor coating installation, embodying the invention, with a turning planetary gear train;

FIGS. 2a and 2b are sections along the line II—II of FIG. 1, but showing the pawl mechanism of the installation in the two operating positions.

DESCRIPTION OF THE PREFERRED EMBODIMENT

Figure 3:
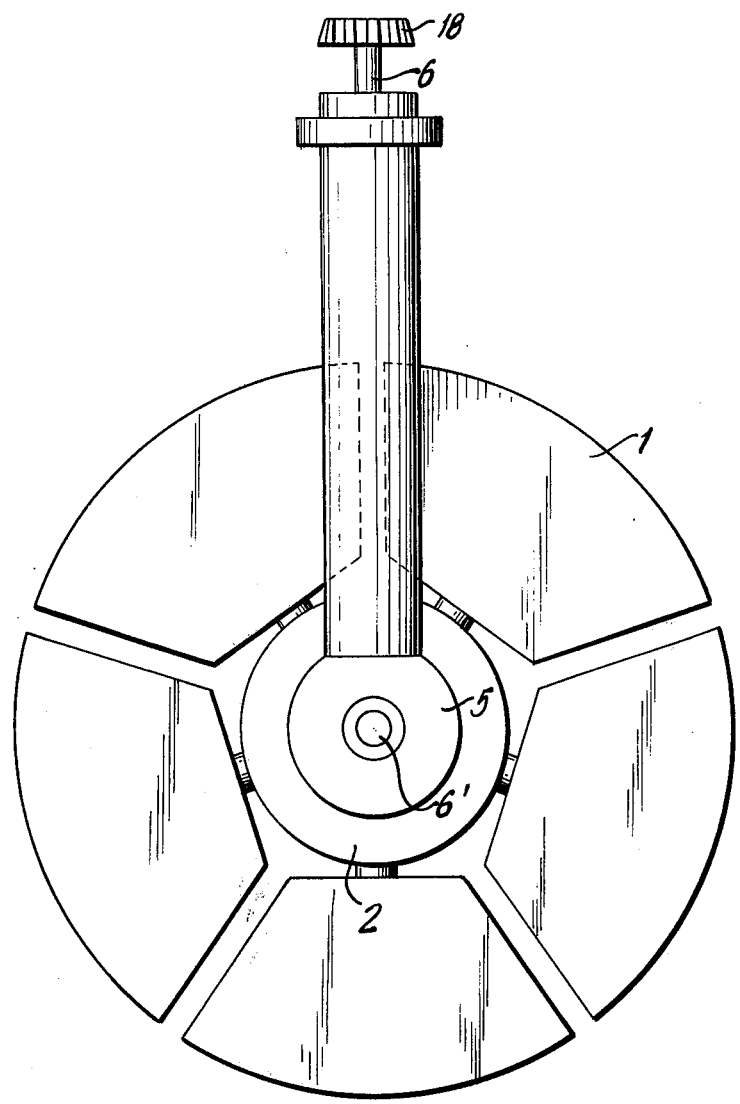
FIG. 3 is a top plan view, to a larger scale, illustrating a single hemisphere carried by a support head and formed by five substrate holding plates.

Referring to the drawings, the coating chamber 1, which is shown only diagrammatically, comprises, at its top, a flange 22 for a cover 23 which carries the entire planetary turning-gear train. The coating of the substrates carried by the gear train is effected, for example, by vacuum vapor deposition, for which the schematically indicated vapor source 24 is provided. Any kind of vapor source may be provided, particularly the usual electrically heated vaporization crucibles as well as electron beam vaporization systems. Alternatively, vapor source 24 may represent an arrangement for cathode disintegration. In accordance with the present invention the source 24 represents any kind of device from which, during operation, atoms or molecules are emitted throughout a certain solid angle, and which can precipitate on the substrates to be coated. In the conventional coating methods, a vacuum must always be employed, and therefore chamber 21 must be evacuable in order to create a vacuum therein. For this purpose, and evacuation nipple 25 is provided in chamber 21, and appropriate pumps can be connected thereto. The vertical central drive shaft 16 passes through cover 23 in vacuum-proof sealed relation.

The various substrate support plates 1 are rotatably mounted on each support head 2 by bearings 17, and are coupled together through a drive bevel gear 4 and driven bevel gears 3. Gear 4 is mounted, with its shaft 6' rotatable in drive housing 5, in support head 2. Driving of gear 4 is effected through shaft 6 and bevel gears 7 and 8. Each shaft 6 has secured, at its other end, a gear 18 which, upon a rotary movement of central drive shaft 16 and hence of holding arms 20, rolls around the annular gear rim 26 on the outer side of a cylinder 27 secured to cover 23 coaxial with shaft 16.

The drive moment of shaft 6 consequently is transmitted initially to drive gear 4. This drive moment can then be used either for turning the substrate holding plates 1 or for simultaneously rotating all the support or holding plates carried by a support head 2, and which plates conjointly define a rotatable cup or hemisphere, which is rotatable about the shaft 6' secured to drive gear 4. Depending on whether support head 2 is retained engaged with drive housing 5 or retained engaged with gear 4, either a turning movement or a rotary movement occurs.

In order that, after each change of the direction of rotation of shaft 16, necessarily first a turning movement and only thereafter a rotary movement will occur, an arrangement is provided which will now be described. Support head 2 has pivotally mounted thereon, by means of pivots 30, two oppositely acting pawls 9' and 9'', which can block rotary movement of the support head in respective opposite directions by abutment against a stop 31 on a cam plate 10 secured to drive housing 5, and whose form is visible in FIGS. 2a and 2b. A cam plate 11 is fastened on gear 4, and is engaged by rollers 32 on pawls 9' and 9". Cam plate 11 assues that always only one pawl is engaged in the blocking position, while the other pawl is raised, that is, the other pawl is inoperative. In FIG. 2a, pawl 9' is in blocking engagement by virtue of its abutment with stop 31 on fixed cam plate 10, while pawl 9" is lifted out of operative position by cam plate 11 so that the substrate holding plates 1 can move only in the direction shown in the drawing.

If the direction of rotation is now reversed, support head 2 initially will be held against movement by virtue of the engagement of pawl 9' with stop 31. However, the driving moment, in the reverse direction of rotation, acts on gear 4 and on cam plate 11 connected to gear 4, so that cam plate 11 thus turns, relative to the fixed support head 2, counter to the direction of the arrow shown in FIG. 2a. As can be seen from the form of the cam plate 11, this initially brings pawl 9" into its operative position engaging the stop 31 on fixed cam plate 10 and, after further rotation of cam plate 11 in a direction counter to the arrow shown in FIG. 2a, pawl 9' is raised or lifted to the inoperative position. The parts now occupy the position shown in FIG. 2b. Substantially simultaneously with the lifting of pawl 9', the relative movement of cam plate 11 is limited by the stop bolt 12 so that rotary movement of support head 2 in such reverse direction of rotation is effected.

The movement of cam plate 11 and gear 4 relative to support head 2 thus effects, as can be seen from the drawing, a simultaneous turning of all the substrate holding plates 1 carried by the support head 2. The stop bolt 12, secured to the support head 2, and the tilting spring 13, interconnecting the free ends of the pawls 9' and 9", provide for an exact 180° rotation of the holding plates 1, to a new position.

Several arms 6, each having a respective drive housing 5, may be mounted for rotation with the central drive shaft 16, and each support head 2 may be provided with several associated substrate holding plates 1. Thus, on the right side of FIG. 1, a second such arrangement is shown in elevation, and corresponds exactly to the arrangement shown on the left side of FIG. 1 in section, and just described. In the showing on the right side of FIG. 1, three substrate holding plates 1 are visible. Generally, however, and in order to make the capacity of the unit as large as possible, more arms 6 will be provided. Depending on the size of the vacuum chamber schematically illustrated at 21, the length of the arms, and the size of the holding plates 1, or of the hemispheres or planets formed thereby, generally a least three to six planets can be accommodated.

FIG. 3 shows, on a larger scale, a single such hemisphere carried by a support head 2 and formed by five substrate holding plates. In FIG. 3, the numbering of the elements corresponds to that of FIG. 1.

While a specific embodiment of the invention has been shown and described in detail to illustrate the application of the principles of the invention, it will be understood that the invention may be embodied otherwise without departing form such principles.

What is claimed is:

1. In a rotating substrate support for vacuum coating installations, of the type including a central drive by means of a shaft extending into a vacuum chamber in sealed relation thereto, plural support arms secured to the central shaft and each carrying a respective support head, respective support head drive shafts coupled to said central drive shaft, and plural substrate holding plates rotatably mounted on each support head and coupled together by a respective gear train for respective turning about their axes of rotation: the improvement comprising, in combination, two oppositely acting pawls mounted on each support head; a fixed cam plate respective to each support head; each gear train being a planetary gear train including a driving sun gear rotatable responsive to rotation of the associated support head drive shaft and planetary gears, each rotatable with a respective support plate, meshing with said driving sun gear; and a respective second cam plate secured to each driving sun gear for limited oscillation relative to the associated support head; said pawls being effective alternately to connect the associated fixed cam plate to the associated support head in accordance with respective opposite directions of rotation of said central drive shaft; the drive moment exerted on each support head drive shaft effecting rotation of the associated support head, through the associated cam plates and the then effective associated pawl, only when the turning position of the associated support plates corresponds to the direction of rotation of said central drive shaft; the drive moment exerted on each support head drive shaft, responsive to reverse rotation of said central drive shaft, effecting disengagement of the then engaged associated pawl to disconnect the associated cam plates, for turning of the associated support plates to another position responsive to relative rotation of the associated support head and the associated second cam, and engagement of the other associated pawl, for rotation of the support head in the reverse direction; whereby each direction of rotation of said support heads is associated with a specific turning position of the associated support plates.

2. In a rotating substrate support for vacuum coating installations, the improvement claimed in claim 1, including a respective stop on each support head engageable with the associated second cam plate to limit the oscillation of the associated second cam plate relative to the associated support head.

3. In a rotating substrate support for vacuum coating installations, the improvement claimed in claim 2, in which each stop, in cooperation with the associated second cam plate, limits the turning movement of the associated support plates to 180°.

4. In a rotating substrate support for vacuum coating installations, the improvement claimed in claim 1, including a respective drive housing fixed to each support arm, each fixed cma plate being secured to the associated drive housing.

5. In a rotating substrate support for vacuum coating installations, the improvement claimed in claim 1, including a respective tilting spring interconnecting the two oppositely acting pawls of each support head.

* * * * *